United States Patent
Jiang et al.

(10) Patent No.: US 12,356,544 B2
(45) Date of Patent: Jul. 8, 2025

(54) COMPOSITES FOR HIGH-FREQUENCY PRINTED CIRCUIT BOARDS AND METHODS OF MAKING

(71) Applicant: Corning Incorporated, Corning, NY (US)

(72) Inventors: Dayue Jiang, Painted Post, NY (US); Geraint Owen, Palo Alto, CA (US)

(73) Assignee: CORNING INCORPORATED, Corning, NY (US)

( * ) Notice: Subject to any disclaimer, the term of this patent is extended or adjusted under 35 U.S.C. 154(b) by 878 days.

(21) Appl. No.: 17/437,240

(22) PCT Filed: Mar. 2, 2020

(86) PCT No.: PCT/US2020/020627
§ 371 (c)(1),
(2) Date: Sep. 8, 2021

(87) PCT Pub. No.: WO2020/190488
PCT Pub. Date: Sep. 24, 2020

(65) Prior Publication Data
US 2022/0174814 A1 Jun. 2, 2022

Related U.S. Application Data

(60) Provisional application No. 62/819,852, filed on Mar. 18, 2019.

(51) Int. Cl.
| | |
|---|---|
| H05K 1/03 | (2006.01) |
| B29C 43/10 | (2006.01) |
| C08K 3/36 | (2006.01) |
| C08L 25/06 | (2006.01) |
| C08L 27/18 | (2006.01) |

(52) U.S. Cl.
CPC .......... H05K 1/0353 (2013.01); B29C 43/10 (2013.01); C08K 3/36 (2013.01); C08L 25/06 (2013.01); C08L 27/18 (2013.01); *C08L 2203/20* (2013.01); *C08L 2207/04* (2013.01); *H05K 2201/0129* (2013.01); *H05K 2201/015* (2013.01)

(58) Field of Classification Search
CPC ...... C08L 23/04; C08L 23/08; C08L 23/0815; C08L 23/0823; C08L 25/04; C08L 25/06; C08L 71/00; C08L 71/10; C08L 71/12; C08L 27/18

See application file for complete search history.

(56) References Cited

U.S. PATENT DOCUMENTS

| | | | | |
|---|---|---|---|---|
| 2,685,707 A | * | 8/1954 | Llewellyn | D01D 5/04 508/106 |
| 5,545,475 A | * | 8/1996 | Korleski | C08J 5/18 428/317.9 |
| 5,922,453 A | | 7/1999 | Horn et al. | |
| 10,581,115 B2 | | 3/2020 | Badding et al. | |
| 2005/0186376 A1 | | 8/2005 | Rhee et al. | |
| 2010/0086767 A1 | * | 4/2010 | Thottupurathu | B32B 27/322 428/422 |
| 2015/0336338 A1 | | 11/2015 | Bordere et al. | |
| 2019/0363398 A1 | | 11/2019 | Badding et al. | |
| 2020/0053920 A1 | | 2/2020 | Ghosh | |
| 2021/0068249 A1 | | 3/2021 | Addiego et al. | |
| 2021/0198158 A1 | | 7/2021 | Heine et al. | |

FOREIGN PATENT DOCUMENTS

| | | |
|---|---|---|
| CN | 104379639 A | 2/2015 |
| CN | 107075222 A | 8/2017 |
| EP | 3489308 A1 | 5/2019 |
| JP | 2002-265729 A | 9/2002 |
| JP | 2011-184695 A | 9/2011 |
| TW | 201831074 A | 8/2018 |
| TW | 1646137 B | 1/2019 |
| TW | 201908398 A | 3/2019 |
| WO | 98/26431 A1 | 6/1998 |
| WO | 2008/117799 A1 | 10/2008 |
| WO | 2016/076167 A1 | 5/2016 |
| WO | 2018/016489 A1 | 1/2018 |

OTHER PUBLICATIONS

B. Givot, et al. 2006 International Conference on Microwaves, Radar & Wireless Communications, Krakow, Poland, pp. 232-235 (Year: 2006).*
JP2002-265729 machine translation (Year: 2024).*
Chinese Patent Application No. 202080023278.4, Office Action, dated Oct. 19, 2022, 14 pages (7 pages of English Translation and 7 pages of Original Copy); Chinese Patent Office.
Daiqing Li et al., "A simple method for accurate loss tangent measurement of dielectrics using a microwave resonant cavity", IEEE Microwave and Wireless Components Letters, vol. 11, Issue: 3, Mar. 2001, pp. 118-120.
International Search Report and Written Opinion of the International Searching Authority; PCT/US2020/020627 Mailed on Jun. 2, 2020, 11 pages; European Patent Office.
Silverstein et al., "A polytetrafluoroethylene filled ultra-high molecular weight polyethylene composite: Mechanical and wear property relationships", Polymer Engineering and Science, vol. 35, No. 22, 1995, pp. 1785-1794.
Vail et al., "Polytetrafluoroethylene (PTFE) fiber reinforced polyetheretherketone (PEEK) composites", Wear, vol. 270, 2011, pp. 737-741.

* cited by examiner

*Primary Examiner* — Marc S Zimmer
*Assistant Examiner* — Jeffrey S Lenihan

(57) ABSTRACT

A composite includes at least one thermoplastic polymer; and at least one PTFE-based polymer, such that the composite has a dielectric loss tangent of less than $10^{-3}$. Moreover, a method for preparing a composite includes mixing at least one thermoplastic polymer with at least one PTFE-based polymer to form a homogenous mixture; melting the mixture to form a composite material; and hot pressing the composite material to form a composite sheet.

17 Claims, 5 Drawing Sheets

COMPOSITES FOR HIGH-FREQUENCY PRINTED CIRCUIT BOARDS AND METHODS OF MAKING

CROSS-REFERENCE TO RELATED APPLICATIONS

This application claims the benefit of priority under 35 U.S.C. § 371 of International Application No. PCT/US2020/020627, filed on Mar. 2, 2020, which claims the benefit of priority under 35 U.S.C. § 119 of U.S. Provisional Application Ser. No. 62/819,852, filed on Mar. 18, 2019, the content of each of which is relied upon and incorporated herein by reference in its entirety.

This application claims the benefit of priority under 35 U.S.C. § 119 of U.S. Provisional Application Ser. No. 62/819,852, filed on Mar. 18, 2019, the content of which is relied upon and incorporated herein by reference in its entirety.

BACKGROUND

1. Field

The disclosure relates to composites for printed circuit board (PCB) applications.

2. Technical Background

Currently available printed circuit boards (PCBs) typically utilize either FR4 composites (i.e., consisting of woven fiberglass cloth with epoxy resin binders) or polytetrafluoroethylene (PTFE)-based composites (i.e., using PTFE as the base polymer/dielectric polymer with predetermined amounts of (1) micro-fiber glass; (2) woven glass reinforcement; or (3) ceramic impregnated therein).

Future PCBs are contemplated as having dielectric loss tangents of about $5\times10^{-4}$ or lower at frequencies of about 10 GHz or higher, as well as enhanced thermal stabilities (e.g., coefficients of thermal expansion, CTE), mechanical properties (stability during post-processing: machining etc.), and bonding properties. FR4 composites suffer from high dielectric loss (loss tangents greater than $10^{-3}$) due to high dielectric loss properties of the individual components (e.g., the fiberglass weave cloth and epoxy resin binder). PTFE-based composites suffer from poor post-processing ability (e.g., inadequate dimensional stability during machining), and/or poor bonding properties (e.g., inadequate adhesion to copper foil cladding).

This disclosure presents improved composites for printed circuit board (PCB) applications.

SUMMARY

In some embodiments, a composite, comprises: at least one thermoplastic polymer; and at least one PTFE-based polymer, wherein the composite has a dielectric loss tangent of less than $10^{-3}$.

In one aspect, which is combinable with any of the other aspects or embodiments, the at least one thermoplastic polymer comprises at least one of cyclic olefin copolymers, polystyrene polymers, fluoropolymers, polyetheretherketone polymers, polyetherimide polymers, liquid crystal polymers, polypropylene polymers, cyclic olefins, linear olefins, bi-cyclic olefin norbornene and ethylene, or combinations thereof.

In one aspect, which is combinable with any of the other aspects or embodiments, the at least one thermoplastic polymer comprises at least one of:

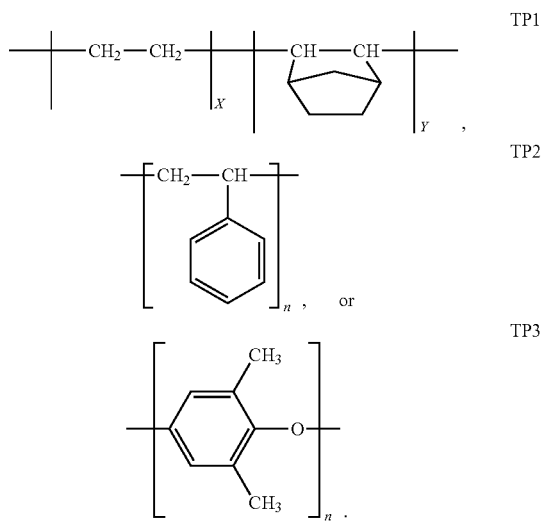

In one aspect, which is combinable with any of the other aspects or embodiments, the at least one thermoplastic polymer comprises a first thermoplastic polymer and a second thermoplastic polymer, the first thermoplastic polymer comprises a fluoropolymer, and the second thermoplastic polymer comprises cyclic olefin copolymers, polystyrene polymers, polyetheretherketone polymers, polyetherimide polymers, liquid crystal polymers, polypropylene polymers, cyclic olefins, linear olefins, bi-cyclic olefin norbornene and ethylene, or combinations thereof.

In one aspect, which is combinable with any of the other aspects or embodiments, the fluoropolymer is selected from the group comprising: fluorinated ethylene propylene (FEP), poly(vinylidene) fluoride (PVDF), ethylene chlorotrifluoroethylene (ECTFE), perfluoro alkoxy (PFA), or combinations thereof.

In one aspect, which is combinable with any of the other aspects or embodiments, the ratio of the at least one thermoplastic polymer to the at least one PTFE-based polymer is in a range of 1:99 to 99:1.

In one aspect, which is combinable with any of the other aspects or embodiments, the ratio of the at least one thermoplastic polymer to the at least one PTFE-based polymer is in a range of 40:60 to 60:40.

In one aspect, which is combinable with any of the other aspects or embodiments, the at least one thermoplastic polymer is present in a range of 20 wt. % to 80 wt. %, respective to the weight of the composite.

In one aspect, which is combinable with any of the other aspects or embodiments, the at least one PTFE-based polymer is present in a range of 20 wt. % to 80 wt. %, respective to the weight of the composite.

In one aspect, which is combinable with any of the other aspects or embodiments, the composite further comprises: at least one reinforcing material, wherein the at least one reinforcing material is at least one of a pellet, particle, liquid, powder, short fiber, long fiber, tape, weave, filament, yarn, sheet, or combinations thereof.

In one aspect, which is combinable with any of the other aspects or embodiments, the at least one reinforcing material comprises at least one of silica, alumina, alumina trihydrate, antimony oxide, barium sulfate, calcium carbonate, kaolinite, magnesium hydroxide, talc, titanium dioxide, or combinations thereof.

In one aspect, which is combinable with any of the other aspects or embodiments, the at least one reinforcing material comprises silica present in an amount of at least 50 wt. %.

In one aspect, which is combinable with any of the other aspects or embodiments, at least one of the thermoplastic polymer, PTFE-based polymer, or reinforcing material has a dielectric loss tangent of less than $10^{-3}$.

In one aspect, which is combinable with any of the other aspects or embodiments, the at least one reinforcing material is present in a range of 0.01 wt. % to 50.0 wt. %, respective to the weight of the composite.

In one aspect, which is combinable with any of the other aspects or embodiments, the composite further comprises: at least one inorganic powder.

In one aspect, which is combinable with any of the other aspects or embodiments, the at least one inorganic powder comprises at least one of silica ($SiO_2$), alumina ($Al_2O_3$), alumina trihydrate ($Al_2O_3 \cdot 3H_2O$), antimony oxide ($Sb_2O_3$, $Sb_2O_5$, $Sb_2O_4$), barium sulfate ($BaSO_4$), calcium carbonate ($CaCO_3$), kaolinite ($Al_2Si_2O_5(OH)_4$), magnesium hydroxide ($Mg(OH)_2$), talc ($Mg_3Si_4O_{10}(OH)_2$), titanium dioxide ($TiO_2$), or combinations thereof.

In one aspect, which is combinable with any of the other aspects or embodiments, the at least one inorganic powder is present in a range of 0.01 wt. % to 20.0 wt. %, respective to the weight of the composite.

In one aspect, which is combinable with any of the other aspects or embodiments, the composite further comprises: at least one reinforcing material.

In some embodiments, a method for preparing a composite, comprises: mixing at least one thermoplastic polymer with at least one PTFE-based polymer to form a homogenous mixture; melting the mixture to form a composite material; and hot pressing the composite material to form a composite sheet.

In one aspect, which is combinable with any of the other aspects or embodiments, the mixing further comprises: adding at least one reinforcing material to the mixture prior to the step of melting.

In one aspect, which is combinable with any of the other aspects or embodiments, the mixing further comprises: adding at least one inorganic powder to the mixture prior to the step of melting.

In one aspect, which is combinable with any of the other aspects or embodiments, the mixing further comprises: adding at least one reinforcing material and at least one inorganic powder to the mixture prior to the step of melting.

In one aspect, which is combinable with any of the other aspects or embodiments, the method further comprises: laminating at least one reinforcing material to the composite sheet to form a reinforced composite sheet.

In one aspect, which is combinable with any of the other aspects or embodiments, the step of laminating comprises: forming at least one reinforcing sheet to a first surface of the composite sheet, and/or forming at least one reinforcing sheet to a second surface of the composite sheet.

In one aspect, which is combinable with any of the other aspects or embodiments, the step of melting is conducted at a temperature in a range of 150° C. to 350° C. and for a time in a range of 5 min to 25 min.

In one aspect, which is combinable with any of the other aspects or embodiments, the composite sheet is a thickness in a range of 50 μm to 1000 μm.

In one aspect, which is combinable with any of the other aspects or embodiments, the step of hot-pressing is conducted at a temperature in a range of 150° C. to 350° C.

In one aspect, which is combinable with any of the other aspects or embodiments, the composite sheet is a homogenous composite sheet.

BRIEF DESCRIPTION OF THE DRAWINGS

The disclosure will become more fully understood from the following detailed description, taken in conjunction with the accompanying figures, in which.

DETAILED DESCRIPTION

Figure 1A:
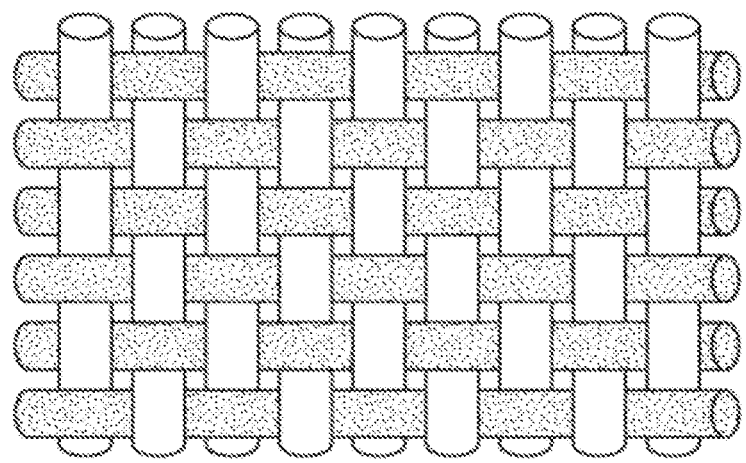
FIGS. 1A to 1F illustrate forms of the reinforcing material, according to some embodiments.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments. It should be understood that the present application is not limited to the details or methodology set forth in the description or illustrated in the figures. It should also be understood that the terminology is for the purpose of description only and should not be regarded as limiting.

Additionally, any examples set forth in this specification are illustrative, but not limiting, and merely set forth some of the many possible embodiments of the claimed invention. Other suitable modifications and adaptations of the variety of conditions and parameters normally encountered in the field, and which would be apparent to those skilled in the art, are within the spirit and scope of the disclosure.

Disclosed are compounds, compositions, and components that can be used for, can be used in conjunction with, can be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of molecules A, B, and C are disclosed as well as a class of molecules D, E, and F and an example of a combination molecule, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

A weight percent of a component, unless specifically stated to the contrary, is based on the total weight of the formulation or composition in which the component is included.

Base Materials

A composite may be used to produce printed circuit boards (PCBs). These composites may simultaneously have low dielectric loss and adequate post-processing ability and bonding properties. Specifically, a plurality of polymers may be used as base materials to form the composites. In some examples, at least one reinforcing material may be used along with the plurality of polymers to form reinforced composites.

Binder/Dielectric Polymer

In some examples, the plurality of polymers includes at least one thermoplastic polymer having excellent dielectric properties (e.g., loss tangent of about 0.0002), high heat deflection temperature (e.g., at least 170° C.) and good mechanical properties (e.g., tensile strength of at least 60 MPa and flexural modulus of at least 3 GPa) The thermoplastic polymer functions as a binder and dielectric polymer providing stiffness and adhesion/bonding properties for the final composite material and may have a dielectric loss tangent of about $2 \times 10^{-4}$, or below $10^{-1}$, or below $10^{-2}$, or below $10^{-3}$, or below $10^{-4}$, or below $10^{-5}$, or below $10^{-6}$, or any intermediate value therein.

In some examples, the at least one thermoplastic polymer may be a cyclic olefin copolymer (COC) or derivatives thereof. In some examples, the at least one thermoplastic polymer may be at least one of a cyclic olefin and a linear olefin (e.g., a bi-cyclic olefin norbornene and ethylene; polytetrafluoroethylene (PTFE) polymers; polypropylene polymers; polystyrene polymers; syndiotactic polystyrene polymers; polyetheretherketone polymers; polyetherimide polymers; liquid crystal polymers (LCP) (e.g., Kevlar®, etc.).

In some examples, the at least one thermoplastic polymer (or combinations thereof) are shown in Table 1.

TABLE 1

| ID No. | Formula | Dielectric Loss Tangent at 10 GHz |
|---|---|---|
| TP1 | 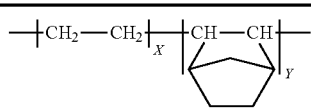 | $2 \times 10^{-4}$ |
| TP2 | 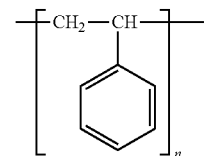 | $4 \times 10^{-4}$ |
| TP3 | 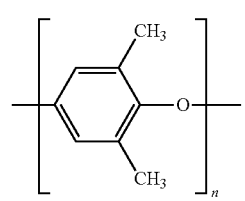 | $1.5 \times 10^{-3}$ |

Filler/Dielectric Polymer

In some examples, the plurality of polymers includes at least one PTFE-based polymer ("PTFE") having excellent dielectric properties (e.g., low loss tangent), flame resistance, and high melting points (e.g., at least 300° C.). The PTFE-based polymer functions as a filler and dielectric polymer providing flame resistance properties for the final composite material and may have a dielectric loss tangent of about $2 \times 10^{-4}$, or below $10^{-1}$, or below $10^{-2}$, or below $10^{-3}$, or below $10^{-4}$, or below $10^{-5}$, or below $10^{-6}$, or any intermediate value therein.

As used herein, "PTFE-based polymers" may refer to homopolymers of tetrafluoroethylene or copolymers of TFE with one or more monomers. Co-monomers having ethylene unsaturation which can be used are both of hydrogenated and fluorinated type; among the hydrogenated ones include ethylene, propylene, acrylic monomers (e.g., methyl methacrylate, (meth)acrylic acid, butylacrylate, hydroxyethylhexylacrylate, etc.), styrene monomers (e.g., styrene, etc.). Fluorinated co-monomers include $C_3$-$C_8$ perfluoroolefins (e.g., hexafluoropropene (HFP)); $C_2$-$C_8$ hydrogenated fluoroolefins (e.g., vinyl fluoride (VF), vinylidene fluoride (VDF), trifluoroethylene, hexafluoroisobutene, perfluoroalkylethylene $CH_2$=CH—$R_f$, wherein $R_f$ is a $C_1$-$C_6$ perfluoroalkyl); $C_2$-$C_8$ chloro- and/or bromo- and/or iodo-fluoroolefins (e.g., chlorotrifluoroethylene (CTFE)); $CF_2$=$CFOR_f$(per)fluoroalkylvinylethers (PAVE), wherein $R_f$ is a $C_1$-$C_6$ (per)fluoroalkyl (e.g., $CF_3$, $C_2F_5$, $C_3F_7$, etc.); $CF_2$=CFOX (per)fluoro-oxyalkylvinylethers, wherein X is a $C_1$-$C_{12}$ alkyl, or a $C_1$-$C_{12}$ oxyalkyl, or a $C_1$-$C_{12}$(per)fluorooxyalkyl having one or more ether groups (e.g., perfluoro-2-propoxy-propyl, fluorodioxoles, perfluorodioxoles, etc.).

In some examples, the plurality of polymers includes at least one thermoplastic polymer and at least one PTFE-based polymer having a thermoplastic polymer-to-PTFE-based polymer of 1:99, or 5:95, or 10:90, or 15:85, or 20:80, or 25:75, or 30:70, or 35:65, or 40:60, or 45:55, or 50:50, or 55:45, or 60:40, or 65:35, or 70:30, or 75:25, or 80:20, or 85:15, or 90:10, or 95:5, or 99:1, or any ratio therein.

In some examples, the plurality of polymers includes at least two thermoplastic polymers, such that at least one of the thermoplastic polymers is a thermoplastic fluoropolymer. Thermoplastic fluoropolymers may increase the loading of fluoro-materials in the final composite since PTFE loading in the composite is limited while also bolster fire resistance. For example, contemplated thermoplastic fluoropolymers include fluorinated ethylene propylene (FEP), poly(vinylidene) fluoride (PVDF), ethylene chlorotrifluoroethylene (ECTFE), perfluoro alkoxy (PFA), or a combination thereof.

In some examples, the plurality of polymers includes at least two thermoplastic polymers, such that at least one of the thermoplastic polymers is a thermoplastic fluoropolymer, with the at least one PTFE-based polymer. In some examples, the plurality of polymers includes at least two thermoplastic polymers, such that at least one of the thermoplastic polymers is a thermoplastic fluoropolymer, without the at least one PTFE-based polymer. In some examples, the plurality of polymers includes at least one thermoplastic fluoropolymer with the at least one PTFE-based polymer. In some examples, the plurality of polymers includes at least one thermoplastic fluoropolymer without the at least one PTFE-based polymer.

In some examples, the composite may comprise at least one thermoplastic polymer present in a range of 1 wt. % to 99 wt. %, or 5 wt. % to 95 wt. %, or 10 wt. % to 90 wt. %, or 15 wt. % to 85 wt. %, or 20 wt. % to 80 wt. %, or 25 wt.

% to 75 wt. %, or 30 wt. % to 70 wt. %, or 35 wt. % to 65 wt. %, or 40 wt. % to 60 wt. %, or 45 wt. % to 55 wt. %, or 1 wt. % to 30 wt. %, or 30 wt. % to 60 wt. %, or 60 wt. % to 99 wt. %, or 15 wt. % to 45 wt. %, or 45 wt. % to 60 wt. %, or 60 wt. % to 75 wt. %, or 75 wt. % to 90 wt. %, or 1 wt. % to 20 wt. %, or 1 wt. % to 10 wt. %, or 80 wt. % to 99 wt. %, or 90 wt. % to 99 wt. %, or any range or value therein.

In some examples, the composite may comprise at least one PTFE-based polymer present in a range of 1 wt. % to 99 wt. %, or 5 wt. % to 95 wt. %, or 10 wt. % to 90 wt. %, or 15 wt. % to 85 wt. %, or 20 wt. % to 80 wt. %, or 25 wt. % to 75 wt. %, or 30 wt. % to 70 wt. %, or 35 wt. % to 65 wt. %, or 40 wt. % to 60 wt. %, or 45 wt. % to 55 wt. %, or 1 wt. % to 30 wt. %, or 30 wt. % to 60 wt. %, or 60 wt. % to 99 wt. %, or 15 wt. % to 45 wt. %, or 45 wt. % to 60 wt. %, or 60 wt. % to 75 wt. %, or 75 wt. % to 90 wt. %, or 1 wt. % to 20 wt. %, or 1 wt. % to 10 wt. %, or 80 wt. % to 99 wt. %, or 90 wt. % to 99 wt. %, or any range or value therein.

In some examples, the plurality of polymers may be initially in the form of a pellet, particle, liquid, powder, fiber (short or long), tape, weave, filament, yarn, sheet, etc.

Reinforcing Material

Figure 1B:
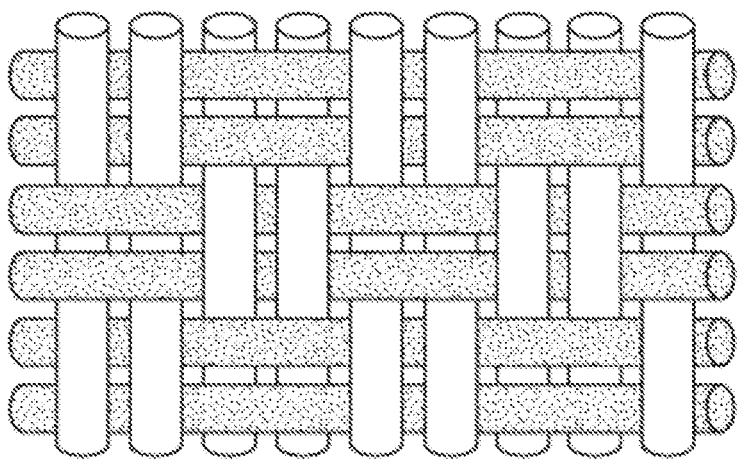
Figure 1C:
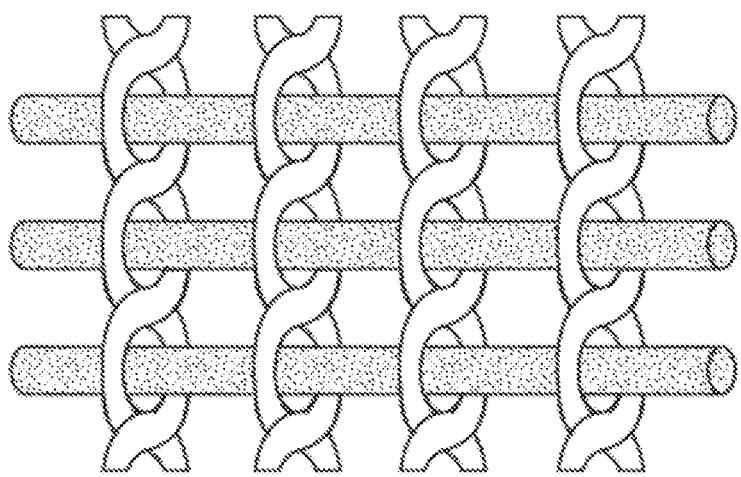
Figure 1D:
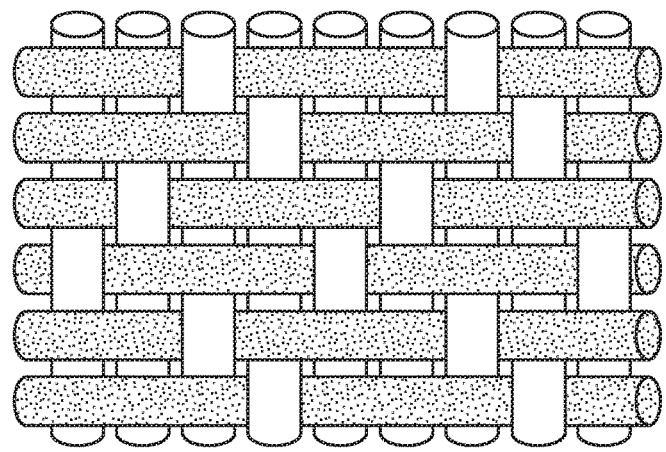
Figure 1E:
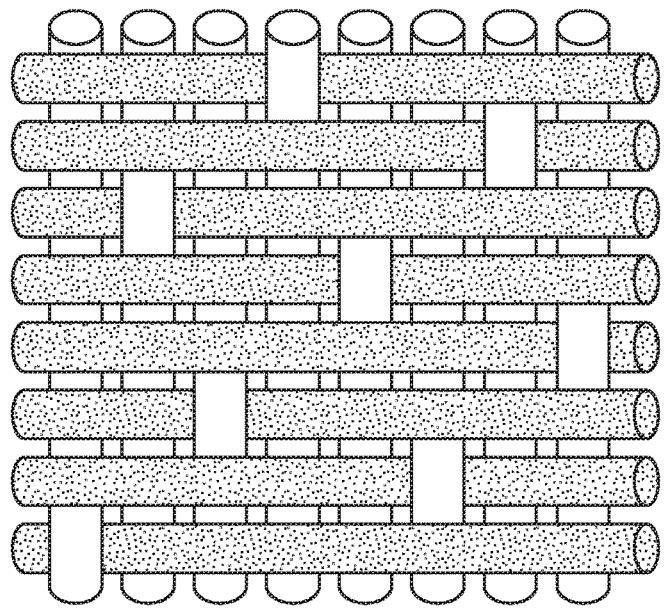
Figure 1F:
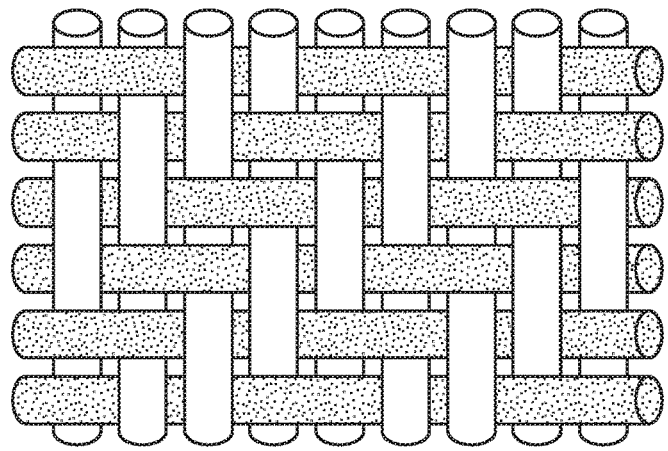

In some examples, at least one reinforcing material may be used along with the plurality of polymers to form reinforced composites. In some examples, the at least one reinforcing material may be initially in the form of a pellet, particle, liquid, powder, fiber (short or long), tape, weave, filament, yarn, sheet, etc. In some examples, the at least one reinforcing material may be initially in the form of a weave having a plain weave pattern (yarns interlaced in an alternating pattern, one over and one under every other yarn strand; provides good fabric stability; FIG. 1A); basket weave pattern (two or more filling yarns alternately interlaced over and under one another; more pliable, flatter, stronger than the plain weave, but not as stable; FIG. 1B); leno weave pattern (locks yarns in place by crossing two or more warp threads over each other and interlacing with one or more fill threads; FIG. 1C); four-harness weave pattern (relies on a three by one interlacing, pattern—yarn floats over three warp yarns and under one; more pliable than the plain weave and is easier to conform to curved surfaces; FIG. 1D); eight-harness weave pattern (one yarn floats over seven warp yarns and under one; very pliable; FIG. 1E); 2×2 twill weave (tightly woven fabric with high density; characterized by a diagonal rib or twill line; warp yarn floats over two consecutive picks, permitting more yarns per unit area; FIG. 1F); or combinations thereof.

In some examples, the at least one reinforcing material may comprise a silica-based material including $SiO_x$ in a range of 1 wt. % to 99 wt. %, or 5 wt. % to 95 wt. %, or 10 wt. % to 90 wt. %, or 15 wt. % to 85 wt. %, or 20 wt. % to 80 wt. %, or 25 wt. % to 75 wt. %, or 30 wt. % to 70 wt. %, or 35 wt. % to 65 wt. %, or 40 wt. % to 60 wt. %, or 45 wt. % to 55 wt. %, or 1 wt. % to 30 wt. %, or 30 wt. % to 60 wt. %, or 60 wt. % to 99 wt. %, or 15 wt. % to 45 wt. %, or 45 wt. % to 60 wt. %, or 60 wt. % to 75 wt. %, or 75 wt. % to 90 wt. %, or 1 wt. % to 20 wt. %, or 1 wt. % to 10 wt. %, or 80 wt. % to 99 wt. %, or 90 wt. % to 99 wt. %, or greater than 99 wt. %, or any range or value therein. In some examples, the at least one reinforcing material may comprise a silica-based material including $SiO_x$ in an amount of at least 1 wt. %, or 2 wt. %, or 5 wt. %, or 10 wt. %, or 15 wt. %, or 20 wt. %, or 25 wt. %, or 30 wt. %, or 35 wt. %, or 40 wt. %, or 45 wt. %, or 50 wt. %, or 55 wt. %, or 60 wt. %, or 65 wt. %, or 70 wt. %, or 75 wt. %, or 80 wt. %, or 85 wt. %, or 90 wt. %, or 95 wt. %, or 100 wt. %, or any value therein. In some examples, the silica-based material may comprise a silica weave made from silica fiber and/or having a dielectric loss tangent less than glass weave.

In some examples, the at least one reinforcing material may comprise a silica-based material ($SiO_2$), a low dielectric loss ceramic (e.g., alumina ($Al_2O_3$), alumina trihydrate ($Al_2O_3 \cdot 3H_2O$), etc.), antimony oxide ($Sb_2O_3$, $Sb_2O_5$, $Sb_2O_4$), barium sulfate ($BaSO_4$), calcium carbonate ($CaCO_3$), kaolinite ($Al_2Si_2O_5(OH)_4$), magnesium hydroxide ($Mg(OH)_2$), talc ($Mg_3Si_4O_{10}(OH)_2$), titanium dioxide ($TiO_2$), or combinations thereof. In some examples, the at least one reinforcing material may have a dielectric loss tangent of about $2 \times 10^{-4}$, or below $10^{-1}$, or below $10^{-2}$, or below $10^{-3}$, or below $10^{-4}$, or below $10^{-5}$, or below $10^{-6}$, or any intermediate value therein.

In some examples, the composite may comprise at least one reinforcing material present in a range of 0.01 wt. % to 50.0 wt. %, or 0.01 wt. % to 25.0 wt. %, or 0.01 wt. % to 20.0 wt. %, or 0.05 wt. % to 17.5 wt. %, or 0.10 wt. % to 15.0 wt. %, or 0.25 wt. % to 12.5 wt. %, or 0.50 wt. % to 10.0 wt. %, or 0.75 wt. % to 7.5 wt. %, or 1.0 wt. % to 7.0 wt. %, or 1.5 wt. % to 6.5 wt. %, or 2.0 wt. % to 6.0 wt. %, or 2.5 wt. % to 5.5 wt. %, or 3.0 wt. % to 5.0 wt. %, or any range or value therein.

Inorganic Powders

In some examples, at least one inorganic powder may be used along with the plurality of polymers to form reinforced composites. In some examples, at least one inorganic powder may be used along with the plurality of polymers and the at least one reinforcing material to form reinforced composites. The inorganic powder functions as a filler and aides to provide enhanced thermal properties and dimensional stability of the final composite, while not significantly affecting the dielectric loss tangent.

In some examples, the at least one inorganic powder is selected from silica ($SiO_2$), alumina ($Al_2O_3$), alumina trihydrate ($Al_2O_3 \cdot 3H_2O$), antimony oxide ($Sb_2O_3$, $Sb_2O_5$, $Sb_2O_4$), barium sulfate ($BaSO_4$), calcium carbonate ($CaCO_3$), kaolinite ($Al_2Si_2O_5(OH)_4$), magnesium hydroxide ($Mg(OH)_2$), talc ($Mg_3Si_4O_{10}(OH)_2$), titanium dioxide ($TiO_2$), or combinations thereof.

In some examples, the at least one inorganic powder is silica including $SiO_x$ in a range of 1 wt. % to 99 wt. %, or 5 wt. % to 95 wt. %, or 10 wt. % to 90 wt. %, or 15 wt. % to 85 wt. %, or 20 wt. % to 80 wt. %, or 25 wt. % to 75 wt. %, or 30 wt. % to 70 wt. %, or 35 wt. % to 65 wt. %, or 40 wt. % to 60 wt. %, or 45 wt. % to 55 wt. %, or 1 wt. % to 30 wt. %, or 30 wt. % to 60 wt. %, or 60 wt. % to 99 wt. %, or 15 wt. % to 45 wt. %, or 45 wt. % to 60 wt. %, or 60 wt. % to 75 wt. %, or 75 wt. % to 90 wt. %, or 1 wt. % to 20 wt. %, or 1 wt. % to 10 wt. %, or 80 wt. % to 99 wt. %, or 90 wt. % to 99 wt. %, or any range or value therein. In some examples, the at least one inorganic powder may comprise silica including $SiO_x$ in an amount of at least 1 wt. %, or 2 wt. %, or 5 wt. %, or 10 wt. %, or 15 wt. %, or 20 wt. %, or 25 wt. %, or 30 wt. %, or 35 wt. %, or 40 wt. %, or 45 wt. %, or 50 wt. %, or 55 wt. %, or 60 wt. %, or 65 wt. %, or 70 wt. %, or 75 wt. %, or 80 wt. %, or 85 wt. %, or 90 wt. %, or 95 wt. %, or 100 wt. %, or any value therein.

In some examples, the composite may comprise at least one inorganic powder present in a range of 0 wt. % to 25.0 wt. %, or 0 wt. % to 10.0 wt. %, or 0.01 wt. % to 20.0 wt. %, or 0.05 wt. % to 17.5 wt. %, or 0.10 wt. % to 15.0 wt. %, or 0.25 wt. % to 12.5 wt. %, or 0.50 wt. % to 10.0 wt. %, or 0.75 wt. % to 7.5 wt. %, or 1.0 wt. % to 7.0 wt. %, or 1.5 wt. % to 6.5 wt. %, or 2.0 wt. % to 6.0 wt. %, or 2.5 wt. % to 5.5 wt. %, or 3.0 wt. % to 5.0 wt. %, or any range or value therein.

EXAMPLES

Example 1—Composite Preparation

Samples are prepared by a melt process shown in FIG. 2 whereby at least one thermoplastic polymer, at least one PTFE-based polymer, and at least one reinforcing material are mixed and subsequently melted at a temperature in a range of 150° C. to 350° C. (e.g., 250° C.), or 175° C. to 325° C., or 200° C. to 300° C., or 225° C. to 275° C., or 250° C. to 350° C., or 150° C. to 250° C., or any range or value therein. Prior to mixing and melting, the at least one reinforcing material is sectioned into predetermined sizes, shapes, and other physical characteristics best suited for the melting process. Moreover, the melting may be conducted for a time in a range of 1 min to 45 min, or 2 min to 30 min, or 5 min to 25 min, or 10 min to 20 min (e.g., 15 min), or 12.5 min to 17.5 min, or any range or value therein. In some examples, the mixture is prepared with at least one thermoplastic polymer and at least one PTFE-based polymer, without the at least one reinforcing material. In some examples, the mixture is prepared with at least one inorganic powder. The final composite has a composition (e.g., ratios, weights, etc.) as described above and is determined by the composition of the initial base materials.

The resulting final composite may then be laminated into sheets at a thickness from 50 μm to 1000 μm, or 100 μm to 900 μm, or 150 μm to 850 μm, or 200 μm to 800 μm, or 250 μm to 750 μm, or 300 μm to 700 μm, or 350 μm to 650 μm, or 400 μm to 600 μm, or 450 μm to 550 μm, or any range or value therein by a hot press or other sufficient technique at a temperature in a range of 150° C. to 350° C. (e.g., 230° C.), or 175° C. to 325° C., or 200° C. to 300° C., or 225° C. to 275° C., or 250° C. to 350° C., or 150° C. to 250° C., or any range or value therein.

Figure 2:
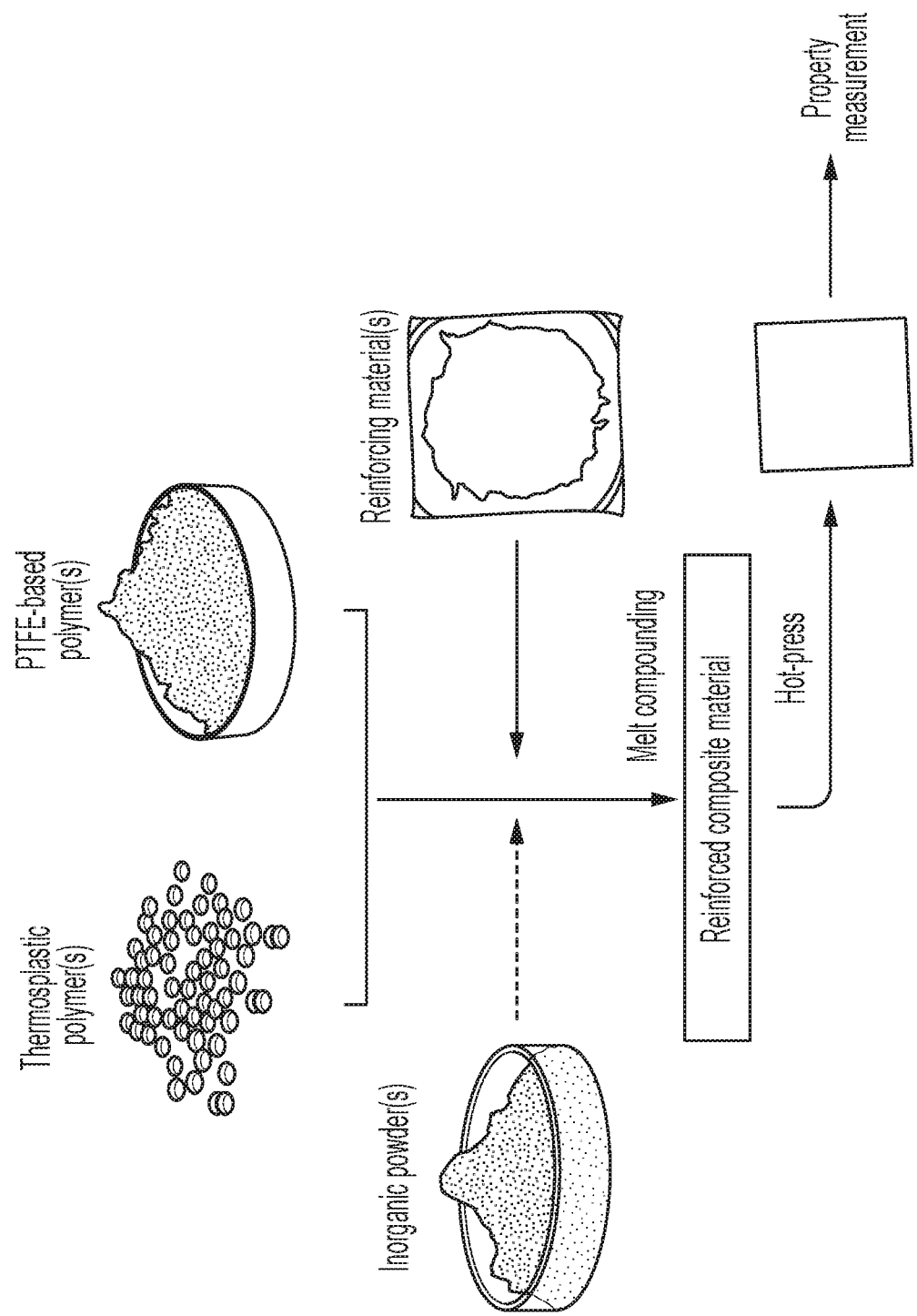
FIGS. 2 to 4 illustrate methods of forming a composite, according to some embodiments.
Figure 3:
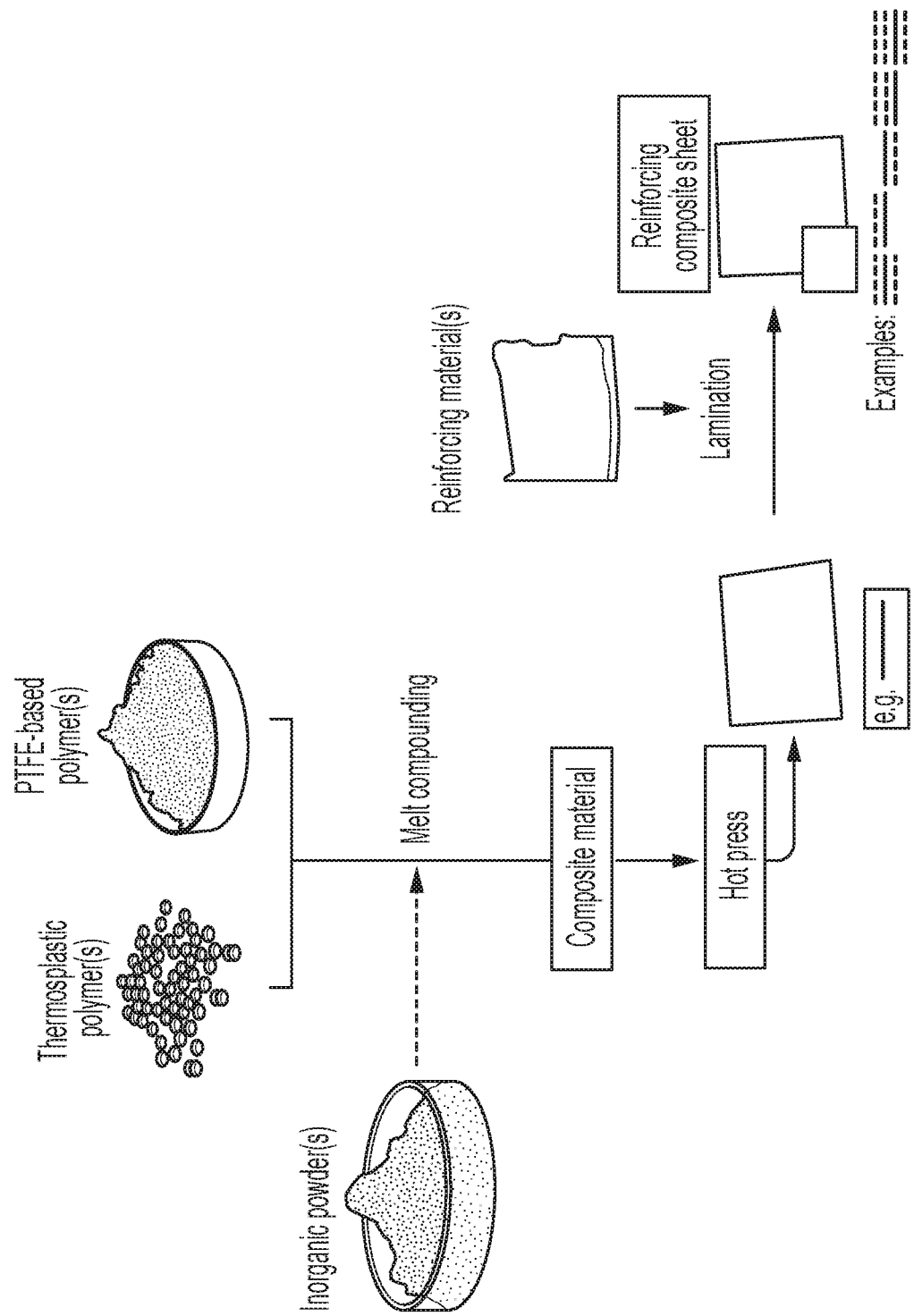

In processes where the at least one reinforcing material is included, the reinforcing material may be homogenously blended and melted with the plurality of polymers (and optionally, the at least one inorganic powders) prior to lamination such that the laminated sheet is evenly distributed with the plurality of polymers, the reinforcing material, and optionally, the inorganic powder (e.g., FIG. 2). In some examples, the mixing (i.e., blending), melting, and hot press process may be conducted with the plurality of polymers (and optionally, the at least one inorganic powders) only, with the reinforcing material included in the composite in a separate lamination whereby at least one reinforcing sheet is added to one or both sides of the hot-pressed composite to form a reinforced composite sheet (FIG. 3).

Figure 4:
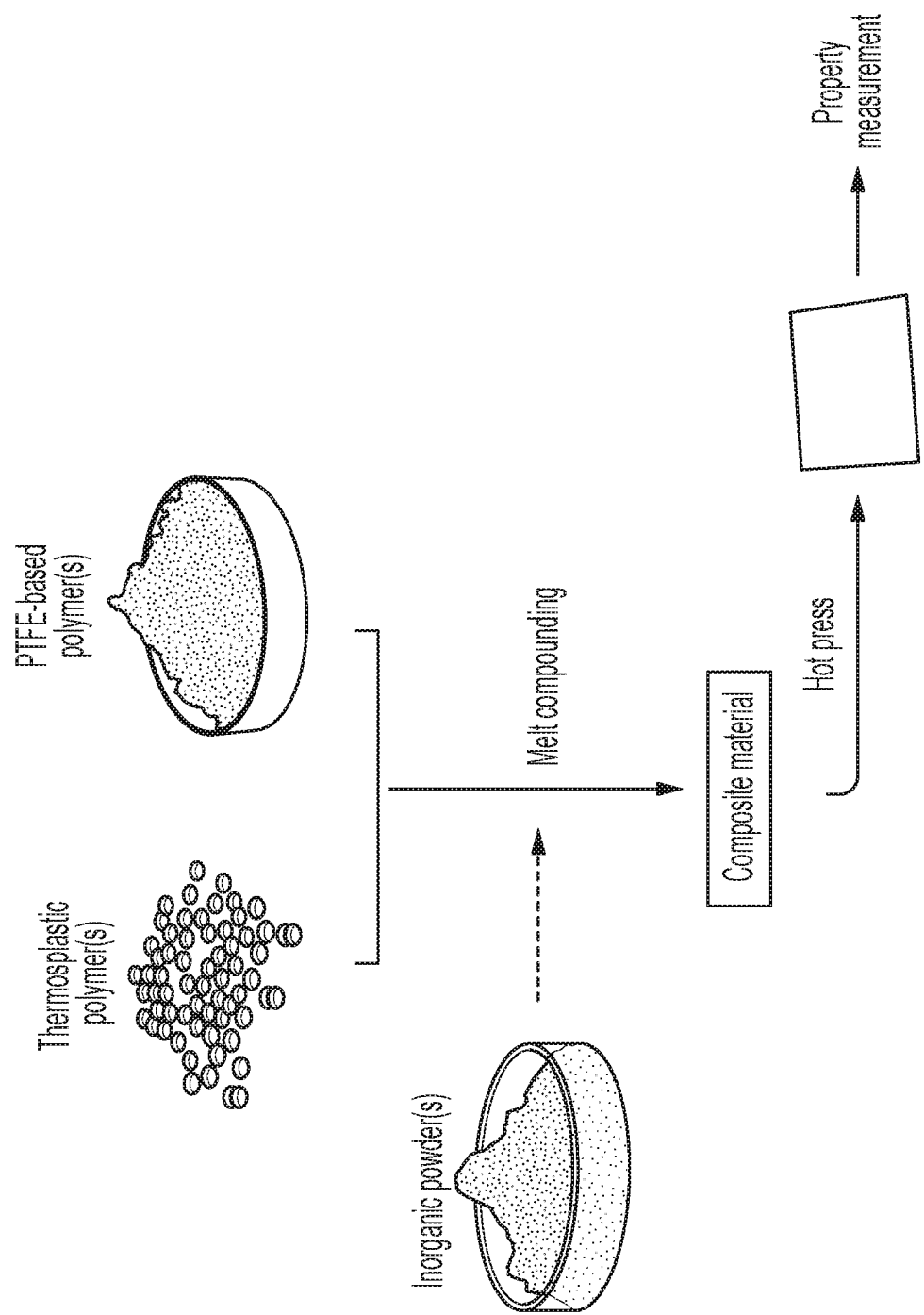

In some examples, where the at least one reinforcing material is not included, the plurality of polymers (and optionally, the at least one inorganic powders) may be homogenously blended and melted (followed by the hot-press lamination into sheet) such that the laminated sheet is evenly distributed with the plurality of polymers and optionally, the inorganic powder (e.g., FIG. 4).

Example 2—Composite Testing

Composites having a composition and prepared as described above have electrical properties as summarized in Table 2.

TABLE 2

| Sample | Description | Permittivity | Dielectric Loss Tangent | Frequency (GHz) |
|---|---|---|---|---|
| 1 | PTFE | 2.05 | $2.1 \times 10^{-4}$ | 9.7 |
| 2 | TP3 | 2.26 | $1.48 \times 10^{-3}$ | 12.4 |
| 3 | TP2 | 2.48 | $5 \times 10^{-4}$ | 9.6 |
| 4 | TP1 | 2.40 | $2.4 \times 10^{-4}$ | 9.8 |
| 5 | TP3/PTFE (60:40) | 2.25 | $1.55 \times 10^{-3}$ | 12 |
| 6 | TP2/PTFE (60:40) | 2.50 | $7 \times 10^{-4}$ | 9.8 |
| 7 | TP1/PTFE (60:40) | 2.13 | $4.8 \times 10^{-4}$ | 9.7 |
| 8 | TP1/PTFE (40:60) (Reinforced) | 1.83 | $5.3 \times 10^{-4}$ | 12.4 |
| 9 | TP1/PTFE (40:60) (Reinforced) | 1.89 | $5.1 \times 10^{-4}$ | 9.7 |
| 10 | (TP1/PTFE)/Reinforcing material/(TP1/PTFE) | 1.96 | $5.4 \times 10^{-4}$ | 12.4 |
| 11 | Reinforcing material/ (TP1/PTFE)/Reinforcing material | 2.15 | $5.1 \times 10^{-4}$ | 9.8 |
| 12 | TP1/PTFE/Silica inorganic powder (40:50:10) | 2.08 | $6.7 \times 10^{-4}$ | 9.7 |
| 13 | TP1/PTFE/Silica inorganic powder (60:20:20) | 2.30 | $8.4 \times 10^{-4}$ | 9.5 |
| 14 | TP2/PTFE/Silica inorganic powder (60:20:20) | 2.54 | $9.9 \times 10^{-4}$ | 9.3 |
| 15 | TP3/PTFE/Silica inorganic powder (40:40:20) | 2.25 | $1.83 \times 10^{-3}$ | 12.3 |

As is seen in Table 2, samples 7-9, all of which use TP1 and PTFE (which themselves (samples 4 and 1, respectively), individually, have a loss tangent of $5 \times 10^{-4}$ or less at about 10 GHz) have a dielectric loss tangent of about $5 \times 10^{-4}$ or less, as compared to samples 5 (TP3/PTFE (60:40)) and 6 (TP2/PTFE (60:40)), which have dielectric loss tangents of greater than about $5 \times 10^{-4}$. Samples 7-9 also display good adhesion properties to metals and stiffness. For example, when the composite material is hot-pressed with a first and a second stainless steel (SS) sheet on either side of the composite, one of the stainless steel sheets retains the composite during a peel test whereby the first SS sheet is pulled directionally away from the second SS sheet. Thus, the composite has a tactile stickiness to adhere to stainless steel surfaces. Similar results are observed with aluminum foils. Furthermore, use of PTFE contributes to the composite's fire-retardant properties.

Example 3

A formulation includes: (1) at least one thermoplastic dielectric polymer melted in the composite as the binder (e.g., Topas (cyclic olefin copolymer), polystyrene, polypropylene/polystyrene blend); and (2) at least one powder fluoropolymer (not melted in making the composite) to improve the flame retardancy of the final product (e.g., powder PTFE, for example, present at ranges up to 60 wt. %).

Example 4

A formulation includes: (1) at least one thermoplastic dielectric polymer and (2) at least one powder fluoropolymer, both as in Example 3, as well as (3) at least one thermoplastic fluoropolymer (e.g., fluorinated ethylene propylene (FEP), perfluoro alkoxy (PFA), etc.) melted in the composite for increasing fluoropolymer load in the composite and thus, better fire-retardant properties (loading of powder fluoropolymer is limited since too much will hinder post-forming processing).

Example 5

A formulation includes the same as described in Example 3 or Example 4, as well as (1) at least one dried inorganic powder (e.g., silica powder and/or alumina powder, for example, present at ranges up to 20 wt. %) for improving thermal properties and dimension stability of the final product. Electrical properties of the final product are sensitive to moisture; inorganic powders absorb moisture.

Example 6

A formulation includes the same as described in Example 3 or Example 4 or Example 5, as well as (1) at least one reinforcing material (e.g., inorganic fiber and/or fabric (i.e., weave) such as silica (for example, present at ranges up to 10 wt. %).

Thus, as presented herein, improved composites for printed circuit board (PCB) applications and methods of fabrication thereof are disclosed. Advantages of the disclosed composites include (1) having dielectric loss tangents of about $5 \times 10^{-4}$ or lower at frequencies of about 10 GHz or higher, and (2) enhanced thermal stabilities (e.g., CTE), mechanical properties (stability during post-processing machining), bonding properties, and fire-retardant capabilities.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As utilized herein, "optional," "optionally," or the like are intended to mean that the subsequently described event or circumstance can or cannot occur, and that the description includes instances where the event or circumstance occurs and instances where it does not occur. The indefinite article "a" or "an" and its corresponding definite article "the" as used herein means at least one, or one or more, unless specified otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be apparent to those skilled in the art that various modifications and variations can be made without departing from the spirit or scope of the claimed subject matter. Accordingly, the claimed subject matter is not to be restricted except in light of the attached claims and their equivalents.

What is claimed is:

1. A composite, comprising:

at least one thermoplastic polymer; and at least one PTFE-based polymer, wherein the composite has a dielectric loss tangent of less than $10^{-3}$ at a frequency of 10 GigaHertz, and wherein the at least one thermoplastic polymer comprises at least one of:

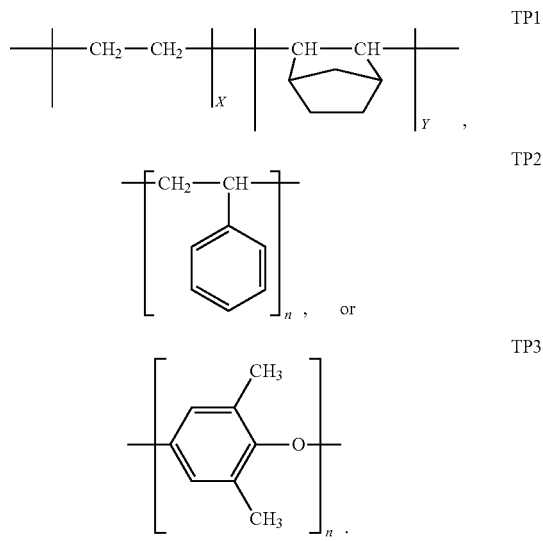

2. The composite of claim 1, wherein the at least one thermoplastic polymer comprises at least one of cyclic olefin copolymers, polystyrene polymers, fluoropolymers, polyetheretherketone polymers, polyetherimide polymers, liquid crystal polymers, polypropylene polymers, cyclic olefins, linear olefins, bi-cyclic olefin norbornene and ethylene, or combinations thereof.

3. The composite of claim 1, wherein:

the at least one thermoplastic polymer comprises a first thermoplastic polymer and a second thermoplastic polymer, the first thermoplastic polymer comprises a fluoropolymer, and the second thermoplastic polymer comprises the at least one thermoplastic polymer comprising at least one of:

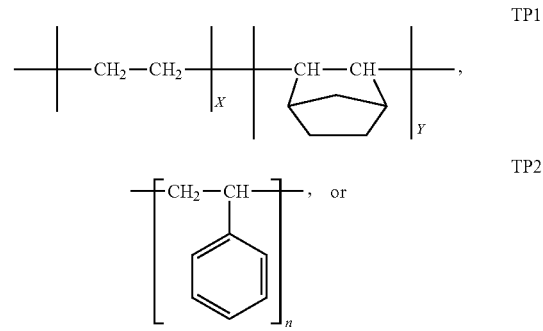

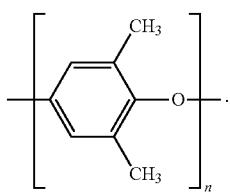

4. The composite of claim 1, wherein a ratio of a total weight of the at least one thermoplastic polymer to a total weight of the at least one PTFE-based polymer is in a range of 1:99 to 99:1 on a wt. % basis relative to a sum of the total weight of the at least one thermoplastic polymer and the total weight of the at least one PTFE-based polymer.

5. The composite of claim 4, wherein the ratio of the at least one thermoplastic polymer to the at least one PTFE-based polymer is in a range of 40:60 to 60:40 on a wt. % basis, respective to the weight of the composite.

6. The composite of claim 1, wherein the at least one thermoplastic polymer is present in a range of 20 wt. % to 80 wt. %, respective to the weight of the composite.

7. The composite of claim 1, wherein the at least one PTFE-based polymer is present in a range of 20 wt. % to 80 wt. %, respective to the weight of the composite.

8. The composite of claim 1, further comprising:
at least one reinforcing material,
wherein the at least one reinforcing material is at least one of a pellet, a particle, a liquid, a powder, a fiber, a tape, a weave, a filament, a yarn, a sheet, or a combination thereof.

9. The composite of claim 8, wherein the at least one reinforcing material comprises at least one of silica, alumina, alumina trihydrate, antimony oxide, barium sulfate, calcium carbonate, kaolinite, magnesium hydroxide, talc, titanium dioxide, or combinations thereof.

10. The composite of claim 8, wherein the at least one reinforcing material comprises silica present in an amount of at least 50 wt. %, respective to the weight of the composite.

11. The composite of claim 8, wherein at least one of the thermoplastic polymer, PTFE-based polymer, or reinforcing material has a dielectric loss tangent of less than $10^{-3}$ at a frequency of 10 GigaHertz.

12. The composite of claim 8, wherein the at least one reinforcing material is present in a range of 0.01 wt. % to 50.0 wt. %, respective to the weight of the composite.

13. The composite of claim 1, further comprising:
at least one inorganic powder.

14. The composite of claim 13, wherein the at least one inorganic powder comprises at least one of silica ($SiO_2$), alumina ($Al_2O_3$), alumina trihydrate ($Al_2O_3 \cdot 3H_2O$), antimony oxide ($Sb_2O_3$, $Sb_2O_5$, $Sb_2O_4$), barium sulfate ($BaSO_4$), calcium carbonate ($CaCO_3$), kaolinite ($Al_2Si_2O_5(OH)_4$), magnesium hydroxide ($Mg(OH)_2$), talc ($Mg_3Si_4O_{10}(OH)_2$), titanium dioxide ($TiO_2$), or combinations thereof.

15. The composite of claim 13, wherein the at least one inorganic powder is present in a range of 0.01 wt. % to 20.0 wt. %, respective to the weight of the composite.

16. The composite of claim 13, further comprising:
at least one reinforcing material.

17. A method for preparing a composite, comprising:
mixing at least one thermoplastic polymer with at least one PTFE-based polymer to form a homogenous mixture;
melting the mixture to form a composite material; and
hot pressing the composite material to form a composite sheet,
wherein the at least one thermoplastic polymer comprises at least one of:

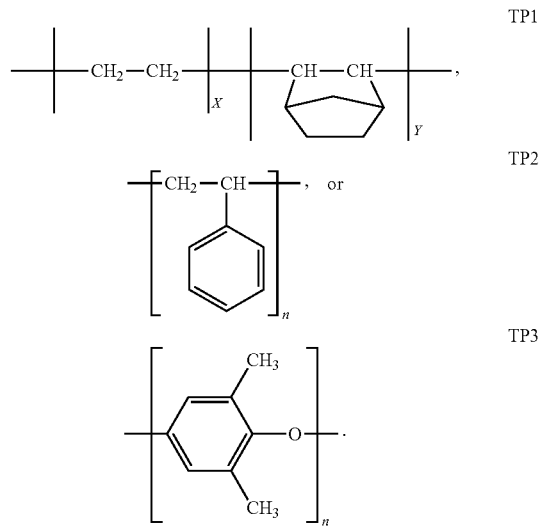

* * * * *